United States Patent
Liu et al.

(10) Patent No.: US 9,472,561 B2
(45) Date of Patent: Oct. 18, 2016

(54) MANUFACTURING METHOD FOR SEMI-FLOATING GATE DEVICE

(71) Applicant: SU ZHOU ORIENTAL SEMICONDUCTOR CO., LTD., Suzhou, Jiangsu (CN)

(72) Inventors: Wei Liu, Jiangsu (CN); Lei Liu, Jiangsu (CN)

(73) Assignee: SU ZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 14/432,558

(22) PCT Filed: Apr. 1, 2014

(86) PCT No.: PCT/CN2014/074531
§ 371 (c)(1),
(2) Date: Jun. 24, 2015

(87) PCT Pub. No.: WO2015/032195
PCT Pub. Date: Mar. 12, 2015

(65) Prior Publication Data
US 2015/0303207 A1    Oct. 22, 2015

(30) Foreign Application Priority Data
Sep. 6, 2013  (CN) .......................... 2013 1 0401785

(51) Int. Cl.
*H01L 27/115* (2006.01)
*H01L 21/28* (2006.01)
(Continued)

(52) U.S. Cl.
CPC ... *H01L 27/11521* (2013.01); *H01L 21/28273* (2013.01); *H01L 27/0629* (2013.01);
(Continued)

(58) Field of Classification Search
CPC .................. H01L 27/11521; H01L 21/28273; H01L 29/1037
USPC .......................................................... 257/316
See application file for complete search history.

(56) References Cited

U.S. PATENT DOCUMENTS 7,400,013 B1 *  7/2008  Ariyoshi ............. H01L 29/4236
                                                         257/330
7,468,299 B2 * 12/2008  Ho ........................ H01L 27/115
                                                         257/E21.429
(Continued)

FOREIGN PATENT DOCUMENTS

CN      101494222 A      7/2009
CN      101494222 B      8/2010
(Continued)

OTHER PUBLICATIONS

Espacenet English abstract of CN 103915439 A.
(Continued)

*Primary Examiner* — Amar Movva
*Assistant Examiner* — Omar Mojaddedi
(74) *Attorney, Agent, or Firm* — Ladas & Parry LLP (57) ABSTRACT

A manufacturing method for a semi-floating gate device, mainly comprising a manufacturing method for a floating gate and a floating gate opening area, and the specific process thereof is: reserving a hard mask layer after a U-shaped groove is formed, growing a gate dielectric layer on a surface of the formed U-shaped groove, depositing and etching back a first layer of polysilicon to protect the gate dielectric layer, etching away the exposed gate dielectric layer and hard mask layer, then covering a formed structure to deposit a second layer of polysilicon, then etching a formed polysilicon layer by a photoetching process and an etching process so as to form a floating gate, and forming a floating gate opening area in a self-aligning way. The manufacturing method can simplify the existing manufacturing process for a semi-floating gate device, reduce the difficulty in manufacturing the semi-floating gate device with a U-shaped channel, and improve the yield of the semi-floating-gate device.

16 Claims, 12 Drawing Sheets

(51) Int. Cl.
*H01L 29/66* (2006.01)
*H01L 29/423* (2006.01)
*H01L 27/06* (2006.01)
*H01L 29/10* (2006.01)
*H01L 29/49* (2006.01)
*H01L 29/51* (2006.01)
*H01L 29/739* (2006.01)
*H01L 29/788* (2006.01)
*H01L 29/861* (2006.01)
*H01L 27/07* (2006.01)

(52) U.S. Cl.
CPC ..... *H01L29/1037* (2013.01); *H01L 29/42336* (2013.01); *H01L 29/42364* (2013.01); *H01L 29/4916* (2013.01); *H01L 29/517* (2013.01); *H01L 29/518* (2013.01); *H01L 29/66825* (2013.01); *H01L 29/7391* (2013.01); *H01L 29/788* (2013.01); *H01L 29/7881* (2013.01); *H01L 29/861* (2013.01); *H01L 27/0727* (2013.01)

(56) References Cited

U.S. PATENT DOCUMENTS

| | | | | |
|---|---|---|---|---|
| 7,655,973 | B2* | 2/2010 | Mouli | H01L 27/1027 257/330 |
| 2002/0022322 | A1 | 2/2002 | Liu et al. | |
| 2002/0102774 | A1 | 8/2002 | Kao et al. | |
| 2012/0261744 | A1* | 10/2012 | Wang | H01L 29/7391 257/329 |
| 2012/0267609 | A1* | 10/2012 | Liang | H01L 29/7391 257/39 |
| 2013/0149824 | A1* | 6/2013 | Wang | H01L 29/66356 438/270 |
| 2013/0224919 | A1* | 8/2013 | Ding | H01L 29/4236 438/270 |
| 2014/0091386 | A1* | 4/2014 | Chen | H01L 29/407 257/330 |
| 2014/0175540 | A1* | 6/2014 | Bobde | H01L 29/66719 257/334 |
| 2014/0319600 | A1* | 10/2014 | Kothandaraman | H01L 21/823437 257/330 |

FOREIGN PATENT DOCUMENTS

| | | |
|---|---|---|
| CN | 102169882 A | 8/2011 |
| CN | 102376711 A | 3/2012 |
| CN | 103579126 A | 2/2014 |
| CN | 103915439 A | 7/2014 |
| CN | 104103640 A | 10/2014 |
| CN | 104103678 A | 10/2014 |
| WO | 2014/108065 A1 | 7/2014 |

OTHER PUBLICATIONS

Espacenet English abstract of CN 104103640 A.
English Abstract of CN 102376711 A.
English Abstract of CN 101494222A.
English Abstract of CN 102169882A.
English Abstract of CN 103579126A.

* cited by examiner

MANUFACTURING METHOD FOR SEMI-FLOATING GATE DEVICE

RELATED APPLICATION

This application is a national phase entry under 35 USC 371 of International Patent Application No PCT/CN2014/074531 filed on 1 Apr. 2014, which claims priority from Chinese Patent Application No. 201310401785.9 filed on 6 Sep. 2013, the disclosures of which are incorporated in their entirety by reference herein.

BACKGROUND OF THE INVENTION

1. Field of the Invention

The present invention pertains to the field of semiconductor memory technologies, relates to a method for manufacturing a dynamic random access memory and in particular, relates to a method for manufacturing a semi-floating gate device.

2. Description of Related Art

Semiconductor memories are widely used in many electronic products. There are different requirements for the construction, performance, and density of the semiconductor memory in different application fields. For example, a static random access memory (SRAM) has a very high random access speed and a relatively low integration density, while a standard dynamic random access memory (DRAM) has a very high integration density and a moderate random access speed. Currently, with the continuous expansion of the market demand for semiconductor memories, the processes and methods for manufacturing dynamic random access memory technologies are innovated and many problems which restrain the process for manufacturing dynamic random access memory products are being solved.

Figure 1:
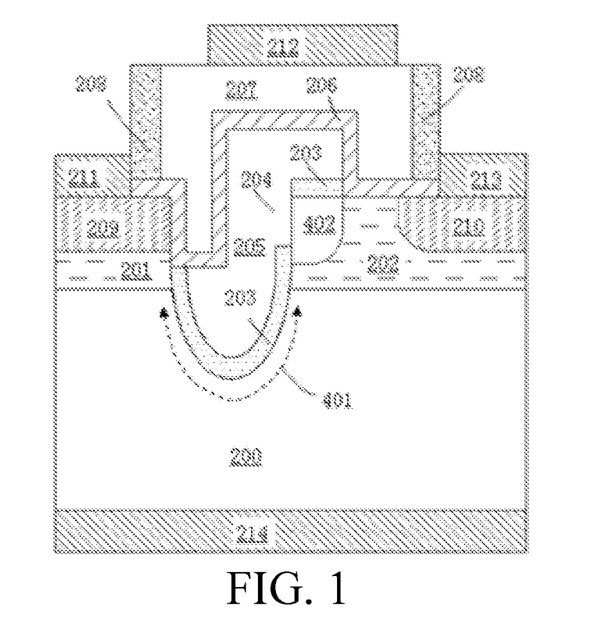
FIG. 1 is a schematic cross-sectional diagram of a semi-floating gate device with a U-shaped channel disclosed in Chinese Patent No. 201310119651.8.

Chinese Patent Application No. 201310119651.8 proposes a U-shaped channel semiconductor device and a manufacturing method thereof. A sectional structure of the U-shaped channel semiconductor device along a length direction of a current channel is as shown in FIG. 1. The memory device includes a source region 201, a drain region 202, and a U-shaped channel region 401 formed in a semiconductor substrate 200, and a first layer of insulating film 203 and a floating gate 205 which is used as a charge storage node and provided with a notch formed above the drain region 202 and the U-shaped channel region 401. A p-n junction diode is formed between the floating gate 205 and the drain region 202 via a floating gate opening region 204. A second layer of insulating film 206 and a control gate 207 are formed, covering the source region 201, the floating gate 205, and the p-n junction diode structure, and in a length direction of a channel of the device, the control gate 207 isolates the source region 201 from a top of the floating gate 205 on a top of the formed U-shaped groove.

Figure 2:
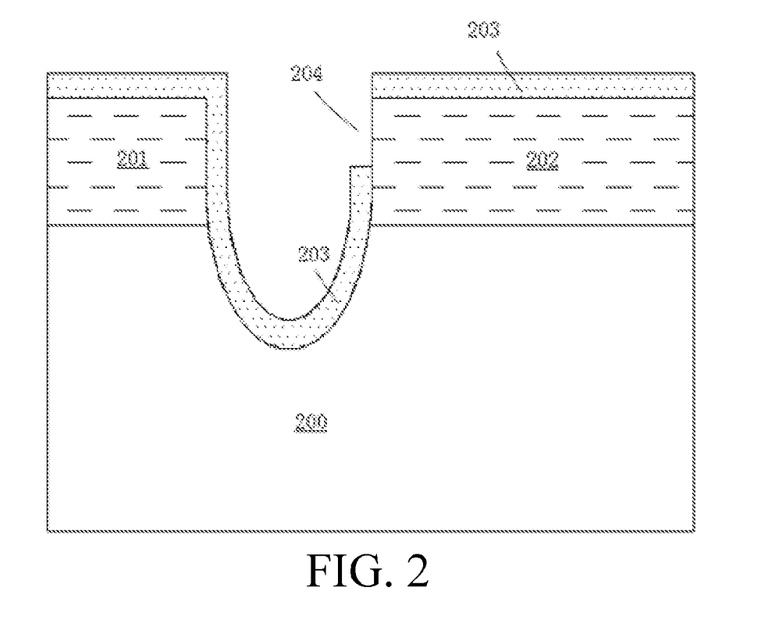
FIG. 2 to FIG. 3 are schematic flowcharts illustrating processes for manufacturing the semi-floating gate device with a U-shaped channel disclosed in Chinese Patent No. 201310119651.8.
Figure 3:
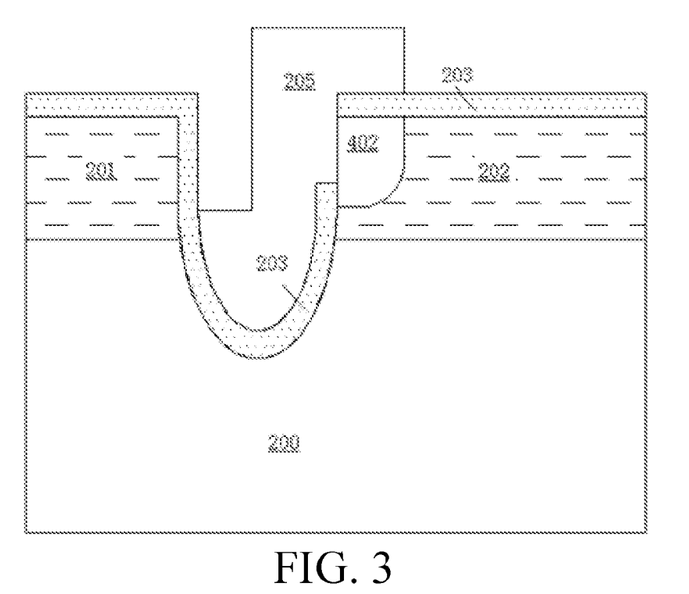

A method for manufacturing the U-shaped channel semiconductor device includes: after forming a U-shaped groove, first removing a hard mask layer 301, further forming a first layer of insulating film 203 on the surface of the U-shaped groove and a semiconductor substrate, and then forming a floating gate opening region 204 in the first layer of insulating film 203 on a side wall located on a top of the U-shaped groove and close to one side of a drain region 202, as shown in FIG. 2; subsequently, further forming a floating gate 205, as shown in FIG. 3. The process procedures of forming a floating gate opening region 204 in the first layer of insulating film 203 on the side wall located on the top of the U-shaped groove and close to one side of the drain region 202 are complex, manufacturing is rather difficult, and it is difficult to control and ensure quality of finished products of the semiconductor device.

SUMMARY OF THE INVENTION

Technical Problem

An objective of the present invention is to provide a method for manufacturing a semi-floating gate device, which overcomes disadvantages of the prior art. The present invention can simplify the existing processes for manufacturing a semi-floating gate device and reduce difficulty in manufacturing a semi-floating gate device, and meanwhile, can improve the yield of semi-floating gate devices.

Technical Solution

The present invention provides a method for manufacturing a semi-floating gate device, including: a process for forming a U-shaped groove in Step 1 and a process for forming a source electrode, a drain electrode, and a control gate in Step 3, where detailed procedures of the process for forming a U-shaped groove in Step 1 includes the following in sequence:

firstly, forming a doped well of a second doping type in a semiconductor substrate of a first doping type;

secondly, forming a first layer of insulating film and a second layer of insulating film in sequence on a surface of the semiconductor substrate; and thirdly, positioning a location of a channel region by means of a photolithography process, and then etching the second layer of insulating film, the first layer of insulating film, and the semiconductor substrate to form a U-shaped groove having a bottom lower than a bottom of the doped well, where the U-shaped groove divides the doped well into a drain region and a source region;

where the method further includes a process for forming a floating gate and a floating gate opening region in Step 2 between the process for forming a U-shaped groove in Step 1 and the process for forming a source electrode, a drain electrode, and a control gate in Step 3, and detailed procedures thereof include the following in sequence:

firstly, growing a third layer of insulating film on a surface of the U-shaped groove in Step 1;

secondly, depositing a first layer of polycrystalline silicon to cover the U-shaped groove, until the first layer of polycrystalline silicon fills up the U-shaped groove;

thirdly, etching back the first layer of polycrystalline silicon, where a top of the remaining first layer of polycrystalline silicon after the etching is located between an upper surface of the second layer of insulating film and the bottom of the doped well;

fourthly, etching away the second layer of insulating film, the first layer of insulating film, and the exposed third layer of insulating film;

fifthly, depositing a second layer of polycrystalline silicon on the structure formed by means of the above-mentioned etching processing, where the second layer of polycrystalline silicon and the first layer of polycrystalline silicon form a polycrystalline silicon layer; and sixthly, depositing a layer of photoresist and forming a pattern by means of a photolithography process, and then etching the polycrystalline silicon layer along the photoresist pattern to form a floating gate and a floating gate opening region, where an etching depth is between a bottom of the drain region and the source region and a top of the third layer of insulating film.

A further preferable solution of the present invention is as follows.

Detailed procedures of the process for forming a source electrode, a drain electrode, and a control gate in Step 3 in the present invention include the following in sequence:

firstly, growing a fourth layer of insulating film on a surface of a device of the structure formed in Step 2, and depositing a third layer of polycrystalline silicon on the fourth layer of insulating film;

secondly, depositing a fifth layer of insulating film on the third layer of polycrystalline silicon;

thirdly, etching the formed fifth layer of insulating film and the third layer of polycrystalline silicon by means of a photolithography process and an etching process and forming, by the remaining third layer of polycrystalline silicon after the etching, a polycrystalline silicon control gate sacrifice material;

fourth, depositing a layer of insulating film on the device of the formed structure and etching back the formed sixth layer of insulating film to form a gate side wall;

fifthly, performing source and drain etching and an epitaxial growth process at both sides of the formed gate side wall, so as to form contact regions of the source region and the drain region;

sixthly, depositing a first layer of interlayer dielectric material on the device of the formed structure and performing polishing until the polycrystalline silicon control gate sacrifice material is exposed;

seventhly, etching away the exposed polycrystalline silicon control gate sacrifice material;

eighthly, depositing a seventh layer of insulating film and a layer of metal control gate material on the fourth layer of insulating film, and performing polishing to enable the metal control gate material to occupy a location of the polycrystalline silicon control gate sacrifice material; and ninthly, depositing a second layer of interlayer dielectric material on the device of the formed structure and arranging contact holes in the second layer of interlayer dielectric material and the first layer of interlayer dielectric material, and forming a source electrode, a drain electrode, and a gate electrode.

Step 3 of the present invention includes after etching away the polycrystalline silicon control gate sacrifice material, first etching away the fourth layer of insulating film and then forming the seventh layer of insulating film and the metal control gate material.

Step 3 of the present invention includes after etching away the polycrystalline silicon control gate sacrifice material, directly forming the metal control gate material on the fourth layer of insulating film.

Step 3 of the present invention includes after forming the gate side wall, directly forming a high-concentration doped region in the source region and the drain region by means of an ion injection method, so as to form contact regions of the source region and the drain region.

A material of the first layer of insulating film of the present invention is silicon oxide, and a material of the second layer of insulating film is silicon nitride.

Materials of the fifth layer of insulating film and the sixth layer of insulating film of the present invention are respectively silicon oxide or silicon nitride.

Materials of the third layer of insulating film, the fourth layer of insulating film, and the seventh layer of insulating film of the present invention are respectively silicon dioxide, silicon nitride, an insulating material with a high dielectric constant, or a laminated layer thereof.

An implementation principle of the present invention is that the manufacturing method of the present invention includes: after a U-shaped groove of an existing semi-floating device is formed, on the basis of retaining an original hard mask layer, first depositing a first layer of polycrystalline silicon and performing an etching back process to protect the gate dielectric layer, and subsequently, removing the hard mask layer; then, depositing a second layer of polycrystalline silicon, subsequently, etching the polycrystalline silicon to form a floating gate of the device by the remaining second layer of polycrystalline silicon and first layer of polycrystalline silicon, and automatically forming a floating gate opening region by a part of the floating gate in contact with a semiconductor substrate.

Advantageous Effects

Compared with the prior art, the present invention has the following notable advantages.

Firstly, a floating gate of the present invention is formed by means of two deposition processes, one photolithography process, and two etching processes, and although the number of processes for manufacturing the floating gate is increased, a photolithography process and an etching process for separately forming a floating gate opening region are omitted, so that process procedures for manufacturing a semi-floating gate device with a U-shaped channel is optimized on the whole, thereby reducing manufacturing difficulty and production costs of the semi-floating gate device with a U-shaped channel.

Secondly, the floating gate opening region of the present invention is formed by means of self-alignment in a procedure for forming the floating gate, so that the process for manufacturing the semi-floating gate device with a U-shaped channel is simple and reliable and exhibits excellent controllability, and the yield of the semi-floating gate devices with a U-shaped channel can be improved.

DETAILED DESCRIPTION OF THE INVENTION

In order to clearly describe specific implementation manners of the present invention, layers and regions disclosed in the present invention are enlarged in terms of thickness in schematic diagrams listed in the accompanying drawings of the description, and sizes of the schematic diagrams do not represent actual sizes; the accompanying drawings are illustrative and shall not define the scope of the present invention. Embodiments listed in the description shall not be limited to specific shapes of regions shown in the accompanying drawings, but include that an obtained shape, for example, has deviation and the like caused by manufacturing and a curve obtained by etching, for another example, usually has a curving or mellow and full characteristic, but the shapes are all represented by rectangles in the embodiments of the present invention; meanwhile, in the following description, a term in use, namely, a substrate, may be interpreted as a semiconductor wafer which is being processed by means of a process and also includes other film layers which are prepared thereon.

The specific implementation manners of the present invention are described in further detail below with reference to embodiments and the accompanying drawings.

The present invention proposes a method for manufacturing a semi-floating gate device, including: forming a U-shaped groove in Step 1, forming a floating gate and a floating gate opening region in Step 2, and forming a source electrode, a drain electrode, and a control gate in Step 3, thereby further manufacturing a semi-floating gate device with a U-shaped channel. According to a technical solution of the present invention in combination with the accompanying drawings, a specific embodiment of a method for manufacturing a semi-floating gate is now further disclosed and a process procedure thereof includes the following in sequence.

Figure 4:
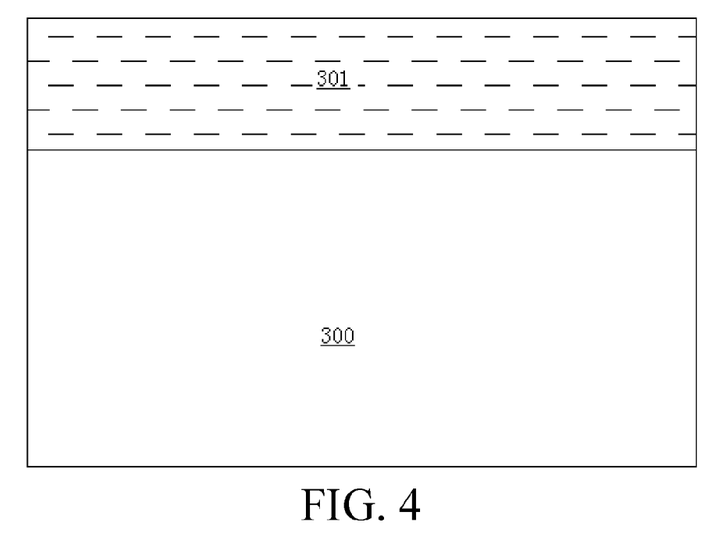
FIG. 4 to FIG. 18 are schematic flowcharts illustrating processes for manufacturing a semi-floating gate device of the present invention.

As shown in FIG. 4, a doped well 301 of a second doping type is formed in an existing semiconductor substrate 300 of a first doping type where a shallow trench isolation structure (STI) has been formed; a material of the semiconductor substrate 300 is silicon or silicon on insulator; the first doping type is an n-type, and the second doping type is a p-type, or the first doping type is the p-type, and the second doping type is the n-type.

Figure 5:
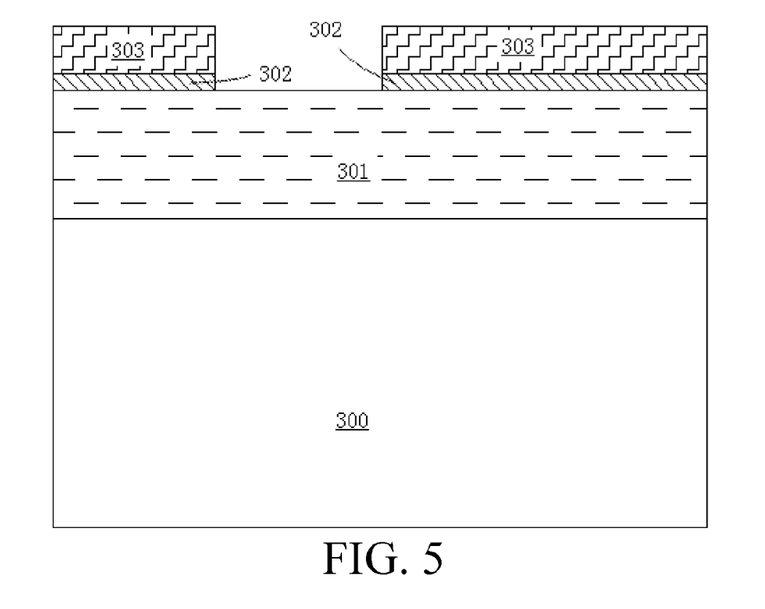

A first layer of insulating film 302 and a second layer of insulating film 303 are grown on a surface of the semiconductor substrate 300 in sequence, then a location of a channel region is determined by means of a photolithography process, and the second layer of insulating film 303 and first layer of insulating film 302 are etched by using a photoresist as a mask, where the etching is stopped on the surface of the semiconductor substrate 300, and are as shown in FIG. 5 after the photoresist is removed; a material of the first layer of insulating film 302 is silicon oxide, and a material of the second layer of insulating film 303 is silicon nitride; and an effect of a silicon oxide film is reducing a stress between the silicon nitride film 303 and the semiconductor substrate 300.

Figure 6:
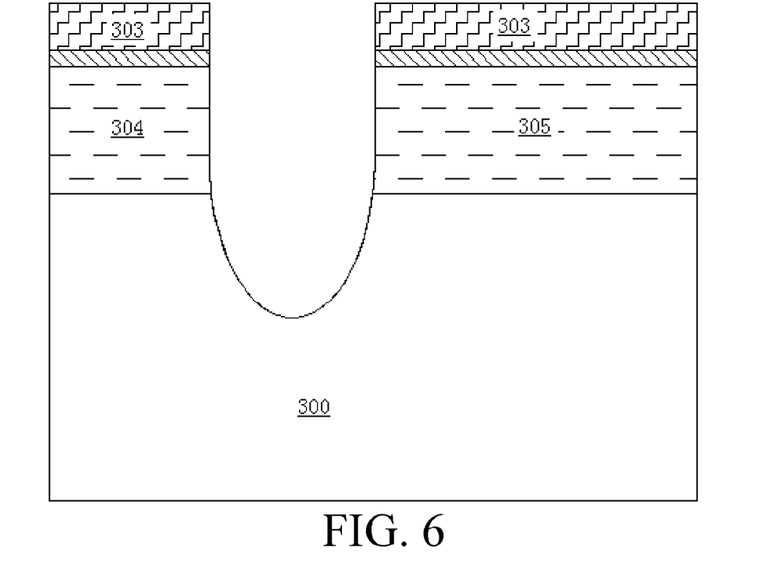

The semiconductor substrate 300 is continued to be etched by using the silicon nitride film 303 and silicon oxide film 302 as masks, a U-shaped groove is formed in the semiconductor substrate 300, and the formed U-shaped groove has a bottom lower than a bottom of the doped well 301 of the second doping type and divides the doped well 301 of the second doping type into two regions which respectively serve as a source region 304 and a drain region 305 of the device, and the semiconductor substrate of the first doping type at the bottom of the U-shaped groove connects the source region 304 with the drain region 305 and forms a channel region of the device, as shown in FIG. 6.

Figure 7:
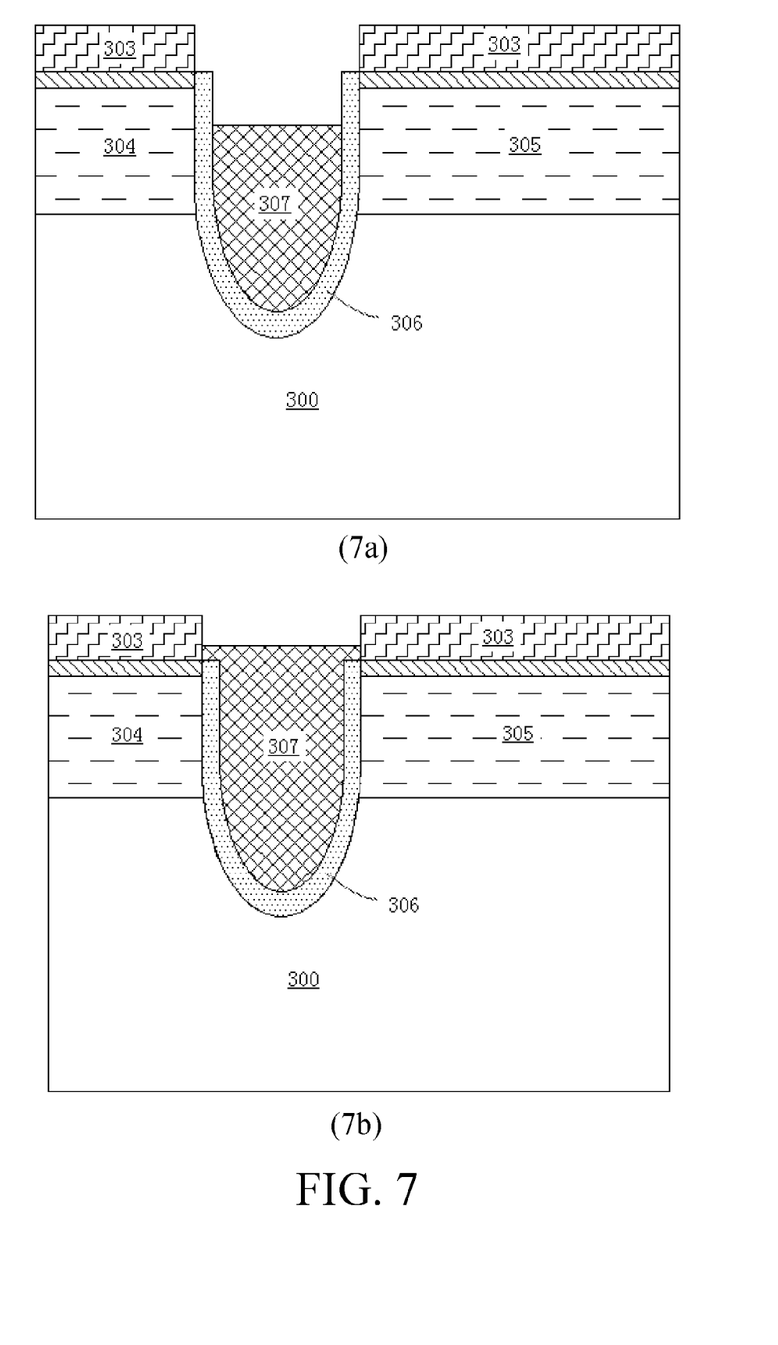

A third layer of insulating film 306 is grown on a surface of the formed U-shaped groove, and a material of the third layer of insulating film 306 is silicon dioxide, silicon nitride, silicon oxynitride, an insulating material with a high dielectric constant, or a laminated layer thereof; subsequently, depositing a first layer of polycrystalline silicon 307 of the first doping type on the formed structure, the deposited first layer of polycrystalline silicon 307 shall fill up the formed U-shaped groove, then the formed first layer of polycrystalline silicon 307 is etched back, and a top of the remaining first layer of polycrystalline silicon 307 after the etching shall be located below an upper surface of the second layer of insulating film 303 and above a bottom of the doped well 301 of the second doping type (namely, bottoms of the source region 304 and drain region 305), as shown in FIG. 7; FIG. 7a illustrates an embodiment where the top of the first layer of polycrystalline silicon 307 after the etching is located below a lower surface of the second layer of insulating film 303 and above the bottom of the doped well 301 of the second doping type; and FIG. 7b illustrates another embodiment where the top of the first layer of polycrystalline silicon 307 after the etching is located below an upper surface of the second layer of insulating film 303 and above a lower surface of the second layer of insulating film 303.

Figure 8:
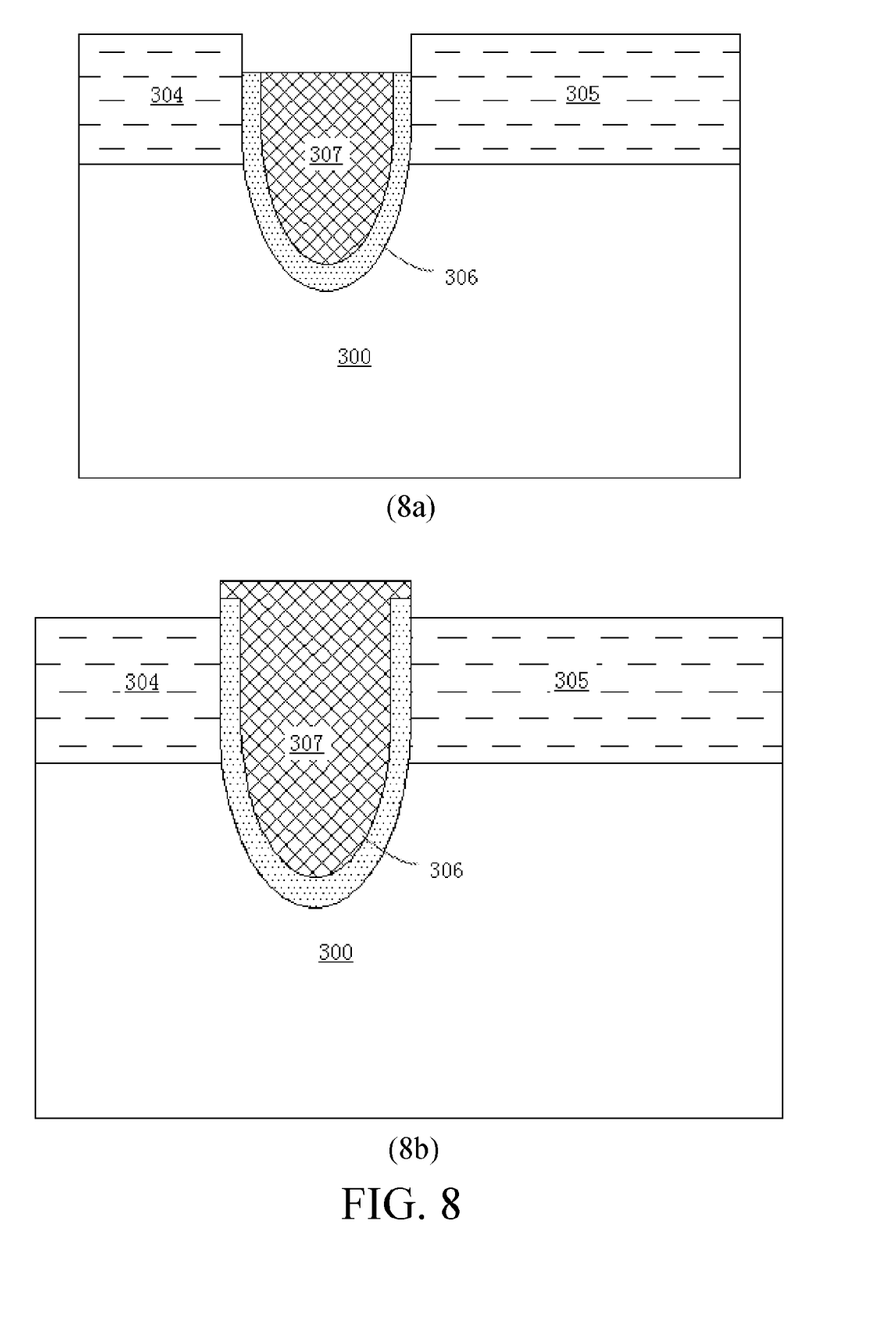

The second layer of insulating film 303, the first layer of insulating film 302, and the exposed third layer of insulating film 306 are etched away, as shown in FIG. 8, where FIG. 8a corresponds to a structure formed after FIG. 7a, and FIG. 8b corresponds to a structure formed after FIG. 7b; in FIG. 7b, because the third layer of insulating film 306 is covered by the first layer of polycrystalline silicon 307, it is unnecessary to etch the third layer of insulating film 306 in this process.

Figure 9:
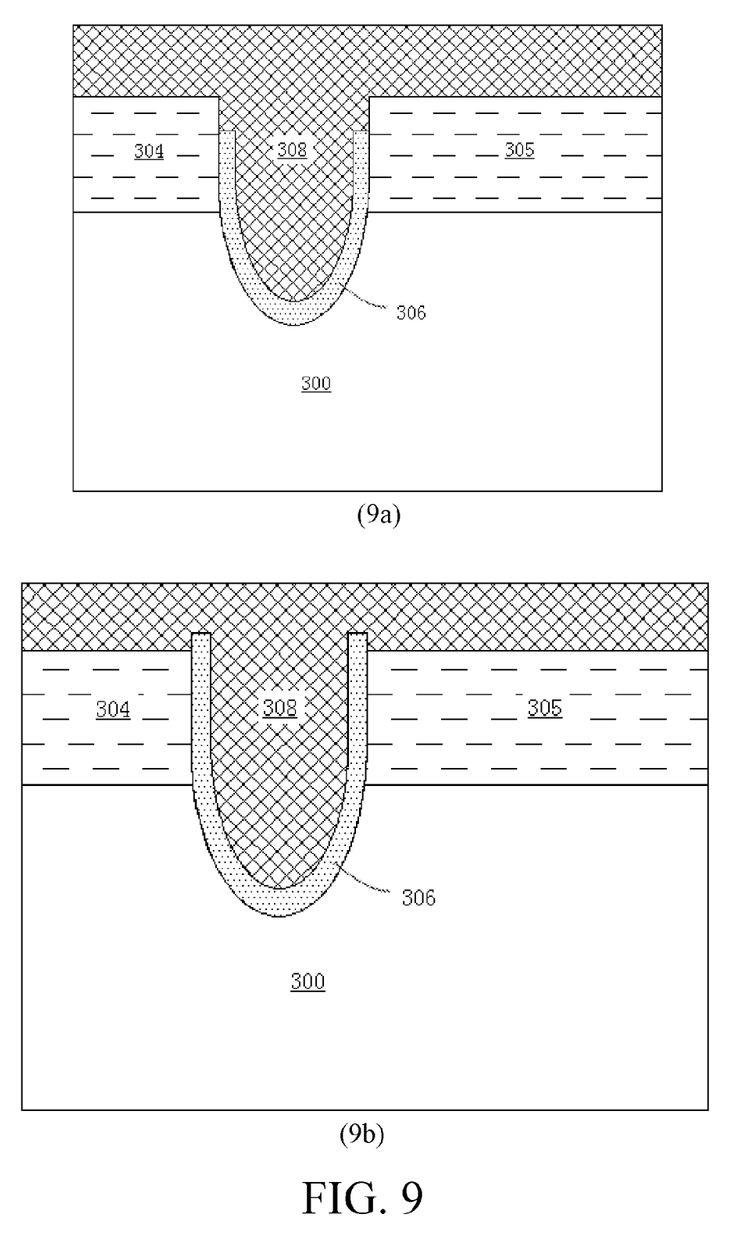

A second layer of polycrystalline silicon of the first doping type is continued to be deposited on a surface of the device of the formed structure, the second layer of polycrystalline silicon of the first doping type and the first layer of polycrystalline silicon 307 constitute a polycrystalline silicon layer 308 of the first doping type together, and the polycrystalline silicon layer 308 is in contact with the source region 304 and drain region 305, as shown in FIG. 9, where: the polycrystalline silicon layer 308 in FIG. 9a is in contact with the source region 304 and drain region 305 at the same time at the top of the U-shaped groove and on the surface of the semiconductor substrate 300, and the polycrystalline silicon layer 308 in FIG. 9b is in contact with the source region 304 and drain region 305 at the same time only on the surface of the semiconductor substrate 300.

The device of the structure shown in FIG. 9a is used below as an example for further describing the method for manufacturing a semi-floating gate device of the present invention.

Figure 10:
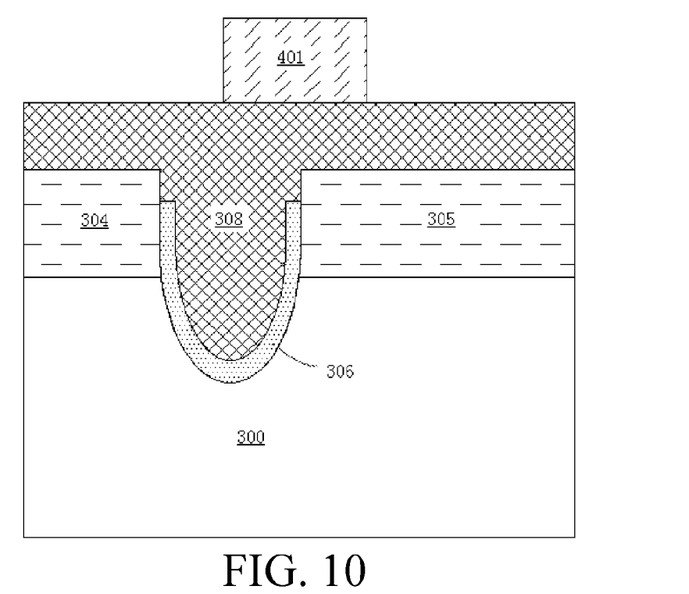

A layer of photoresist 401 is deposited on the polycrystalline silicon layer 308, and then a pattern is formed by means of a photolithography process, as shown in FIG. 10; the remaining photoresist is located above the U-shaped groove and covers a part of the drain region on one side of the drain region 305, but does not cover the source region 304 on one side of the source region 304, and a part of the polycrystalline silicon layer 308 located in the U-shaped groove and close to one side of the source 304 is exposed.

Figure 11:
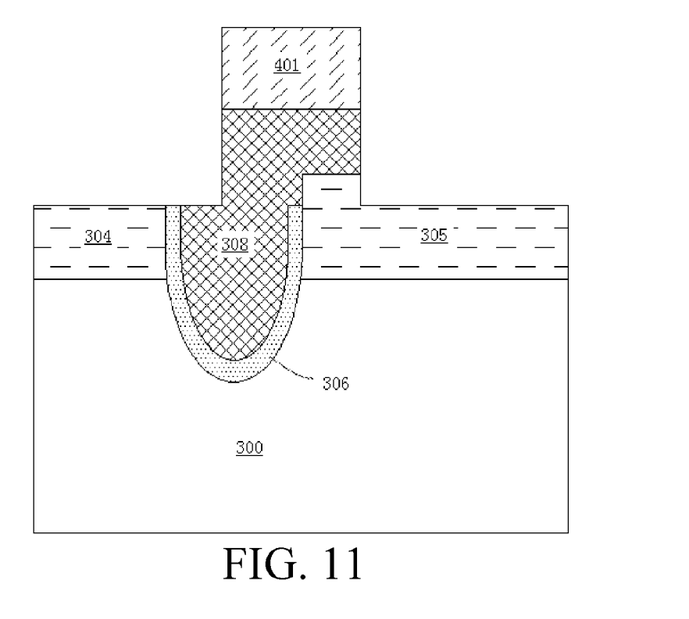

The polycrystalline silicon layer 308 is etched by using the photoresist 401 as a mask, after the semiconductor substrate 300 is exposed, the semiconductor substrate 300 is continued to be etched, a depth for etching the semiconductor substrate 300 shall be higher than the bottoms of the source region 304 and drain region 305 and not higher than a top of the third layer of insulating film 306, and in this embodiment, the depth for etching the semiconductor substrate 300 is on a level with a height of the third layer of insulating film 306; the remaining polycrystalline silicon layer 308 of the first doping type after the etching forms a floating gate 308 of the device; because the photoresist does not cover the source region 304, and a part of the polycrystalline silicon layer 308 located in the U-shaped groove and close to one side of the source 304 is exposed, a notch is formed on one side, close to the source region 304, of the floating gate 308 when the polycrystalline silicon layer 308 and the semiconductor substrate 300 are being etched and is isolated from the source region 304 by the third layer of insulating film 306; and in addition, because the photoresist 401, close to the drain region 305, covers a part of the drain region 305, after the polycrystalline silicon layer 308 and the semiconductor substrate 300 are etched, the floating gate 308, close to the drain region 305, is in contact with a part of the semiconductor substrate 300 which is not etched, and forms, together with the drain region 305, a p-n junction contact, as shown in FIG. 11.

Figure 12:
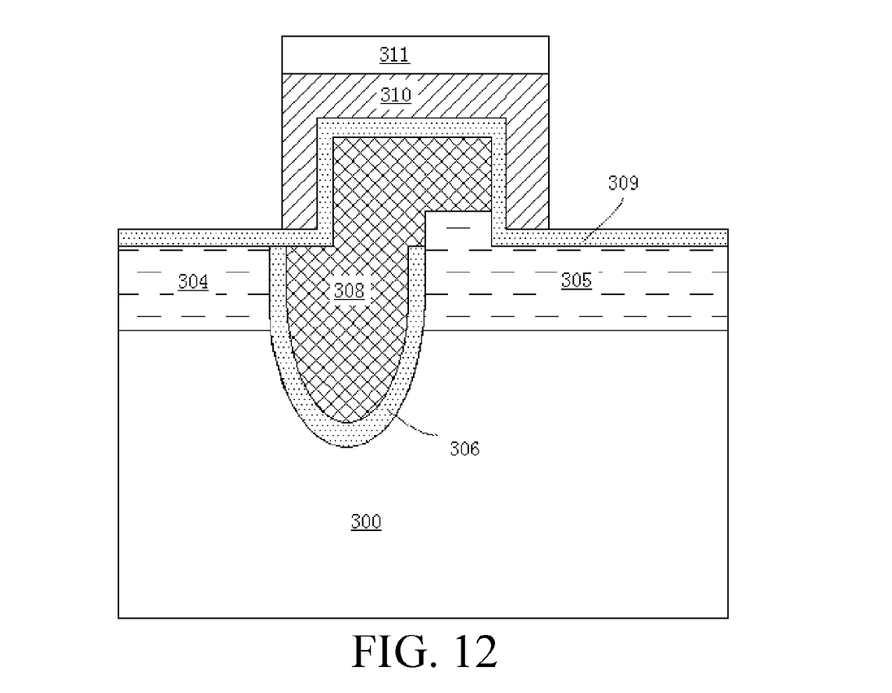

After the photoresist 401 is removed, a fourth layer of insulating film 309 is formed on a surface of the formed structure, subsequently, a third layer of polycrystalline silicon 310 is formed on the formed fourth layer of insulating film 309 and a fifth layer of insulating film 311 is deposited on the third layer of polycrystalline silicon 310, then the formed fifth layer of insulating film 311 and third layer of polycrystalline silicon 310 are etched by means of a photolithography process and an etching process, and the remaining third layer of polycrystalline silicon 310 after the etching forms a polycrystalline silicon control gate sacrifice material of the device, as shown in FIG. 12; because in the process of forming the floating gate 308, the floating gate 308 is in partial contact with the semiconductor substrate 300 and forms, together with the drain region 305, the p-n junction contact, that is, the floating gate 308 covers and protects a part of the drain region 305, after the fourth layer of insulating film 309 is formed, an opening region is automatically formed between the fourth layer of insulating film 309 and the third layer of insulating film 306 (that is, the region where the floating gate 308 covers the drain region 305), and the opening region is a floating gate opening region between the floating gate 308 and the drain region 305; a material of the fourth layer of insulating film 309 is silicon dioxide, silicon nitride, silicon oxynitride, an insulating material with a high dielectric constant, or a laminated layer thereof, and a material of the fifth layer of insulating film 311 is silicon oxide or silicon nitride.

Figure 13:
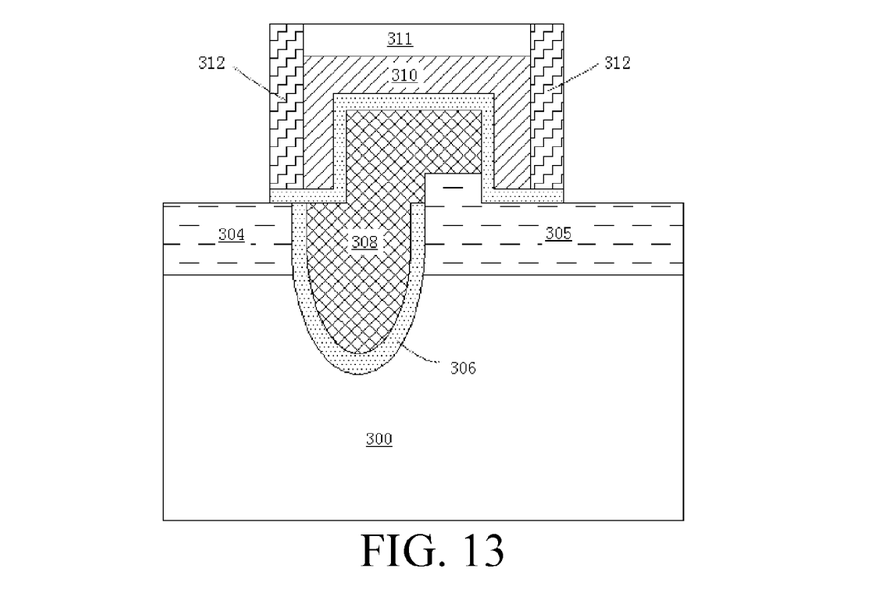

Depositing a sixth layer of insulating film 312 on the formed structure, and etching back the formed sixth layer of insulating film 312 to form a gate side wall, and then the exposed fourth layer of insulating film 309 is etched away to expose the source region 304 and drain region 305, as shown in FIG. 13; and a material of the sixth layer of insulating film 312 is silicon oxide or silicon nitride.

Figure 14:
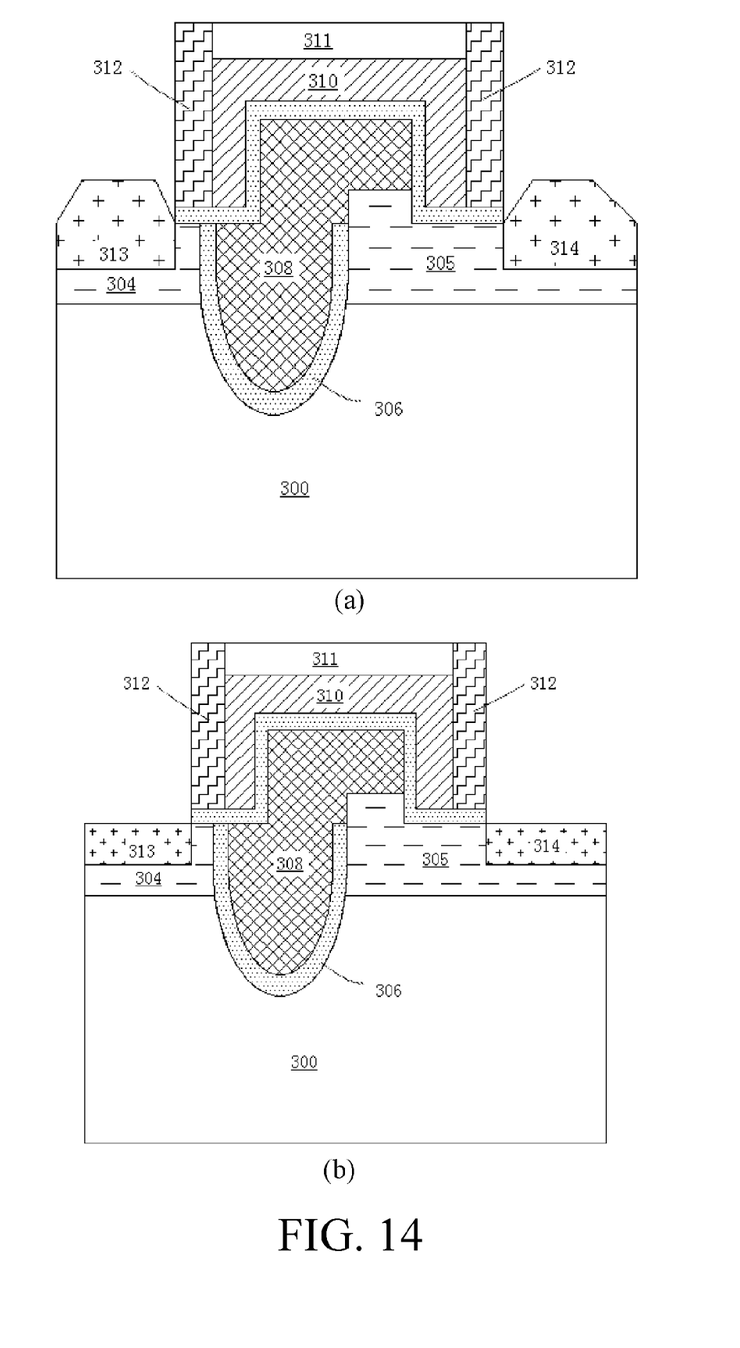

On both sides of the formed gate side wall, the exposed parts of the source region 304 and drain region 305 are etched away, and a silicon germanium or silicon carbide material is epitaxially grown on parts of the source region 304 and drain region 305 after the etching, so as to form a source region contact region 313 and a drain region contact region 314, as shown in FIG. 14a; and alternatively, on both sides of the gates side wall, a high-concentration ion-doped region can be directly formed by means of an ion injection method without undergoing an etching process and an epitaxial growth process in the source region 304 and drain region 305, so as to form a source region contact region 313 and a drain region contact region 314, as shown in FIG. 14b.

Figure 15:
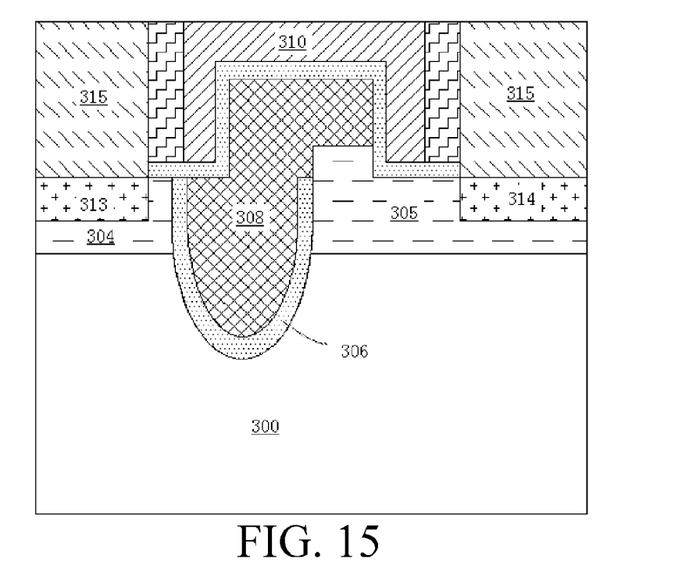
Figure 16:
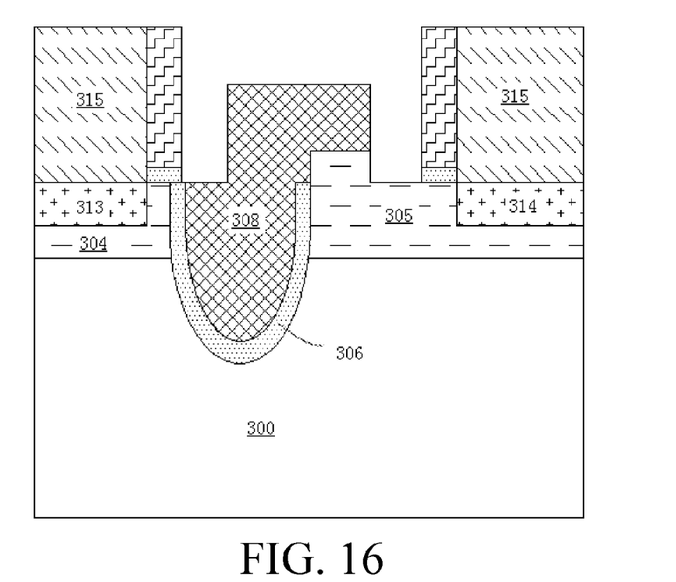
Figure 17:
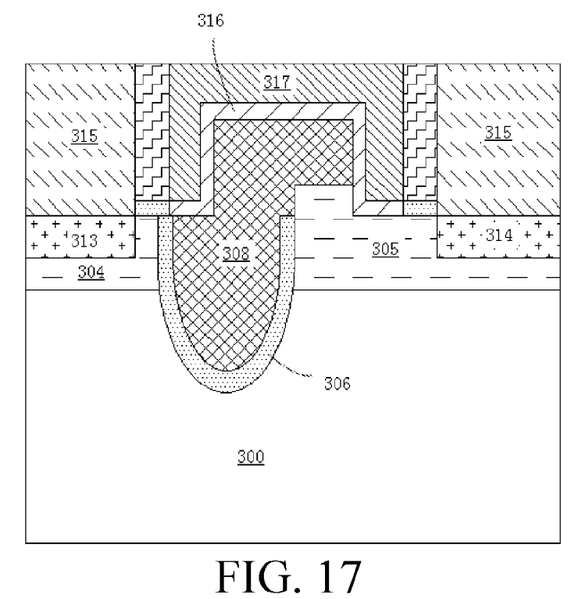

A first layer of interlayer dielectric material 315 is deposited on the device of structure shown in FIG. 14b, and the formed first layer of interlayer dielectric material 315 is polished by means of a chemical-mechanical polishing technique until the polycrystalline silicon control gate sacrifice material 310 is exposed, as shown in FIG. 15; then the exposed polycrystalline silicon control gate sacrifice material 310 and fourth layer of insulating film 309 are etched away, as shown in FIG. 16; subsequently, a seventh layer of insulating film 316 and a layer of metal control gate material are formed over the floating gate 308, and then are polished, so as to enable the metal control gate 317 to occupy a location of the original polycrystalline silicon control gate sacrifice material 310, as shown in FIG. 17; alternatively, the fourth layer of insulating film 309 may be not etched, and an seventh layer of insulating film 316 and a metal control gate 317 are directly formed after the polycrystalline silicon control gate sacrifice material 310 is etched away; alternatively, the fourth layer of insulating film 309 is not etched, and a metal control gate 317 is formed by directly covering the fourth layer of insulating film 309; and a material of the seventh layer of insulating film 316 is silicon dioxide, silicon nitride, silicon oxynitride, an insulating material with a high dielectric constant, or a laminated layer thereof.

Figure 18:
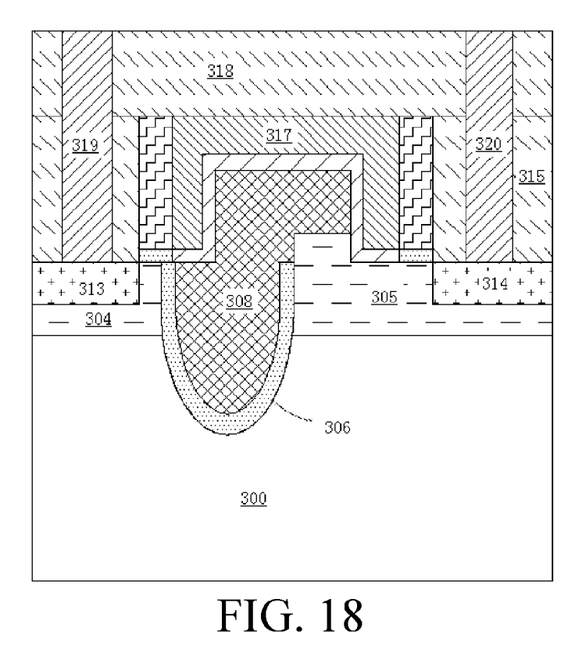

As shown in FIG. 18, a second layer of interlayer dielectric material 318 is deposited, then contact holes are formed in the second layer of interlayer dielectric material 318 and the first layer of interlayer dielectric material 315, and a source electrode 319, a drain electrode 320, and a gate electrode (not shown in FIG. 18) are formed.

An embodiment for manufacturing a semi-floating gate device of the present invention is further described below with reference to the accompanying drawings.

As shown in FIG. 18, a semiconductor substrate 300 of a first doping type is provided, and a source region 304 and a drain region 305 of a second doping type are formed in the semiconductor substrate 300; a U-shaped groove is recessed into the semiconductor substrate 300 and formed between the source region 304 and drain region 305, the semiconductor substrate of the first doping type at a bottom of the U-shaped groove connects the source region 304 and the drain region 305 and forms a channel region of a device; a gate dielectric layer 306 is formed by covering a surface of the U-shaped groove, and a top of the gate dielectric layer 306 shall be located above bottoms of the source region 304 and drain region 305 and not higher than a surface of the semiconductor substrate 300.

A floating gate 308 of the first doping type serving as an electric charge storage node is formed in the U-shaped groove by covering the gate dielectric layer 306, a notch exists on one side, close to the source region 304, of the floating gate 308, a bottom of the notch shall be higher than the bottoms of the source region 304 and drain region 305 and is not higher than a top of the gate dielectric layer 306, the floating gate 308 exceeds the gate dielectric layer 306 at one side, close to the drain region 305, and extends over the surface of the semiconductor substrate 300 and to be in contact with the drain region 305 to form p-n junction contact.

On both sides of the floating 308, surfaces of the source region 304 and drain region 305 are lower than the surface of the semiconductor substrate 300 and are on a level with the bottom of the notch of the floating gate 308, so as to enable the gate dielectric layer 306 to isolate the source region 304 from the floating gate 308; an insulation dielectric layer 316 is formed by covering the source region 304, floating gate 308, and drain region 305, and a metal control gate 317 is formed by covering the insulation dielectric layer 316 and surrounding the floating gate 308; a floating gate opening region exists in the gate dielectric layer 306 and insulation dielectric layer 316, and the floating gate 308 is connected to the drain region 305 through the floating gate opening region; in FIG. 18, the floating gate opening region is located at a top of the U-shaped groove and on a surface of the semiconductor substrate 300 located in the drain region 305 and close to one side of the U-shaped groove; and alternatively, a height of the gate dielectric layer 306 may be on a level with the surface of the semiconductor substrate 300, so that the floating gate opening region is located only on a surface of the semiconductor substrate 300 located in the drain region 305 and close to one side of the U-shaped groove.

A gate side wall 312 is formed on both sides of the metal control gate 317; source region contact 313 and drain region contact 314 are formed on both sides of the gate side wall 312 and in the source region 304 and drain region 305; and an interlayer dielectric material (an insulation dielectric layer material 315 and an insulation dielectric material 318) is formed for isolating the device, and contact holes, a source electrode 319, a drain electrode 320, and a gate electrode (not shown in FIG. 18) are formed in the interlayer dielectric materials.

Figure 19:
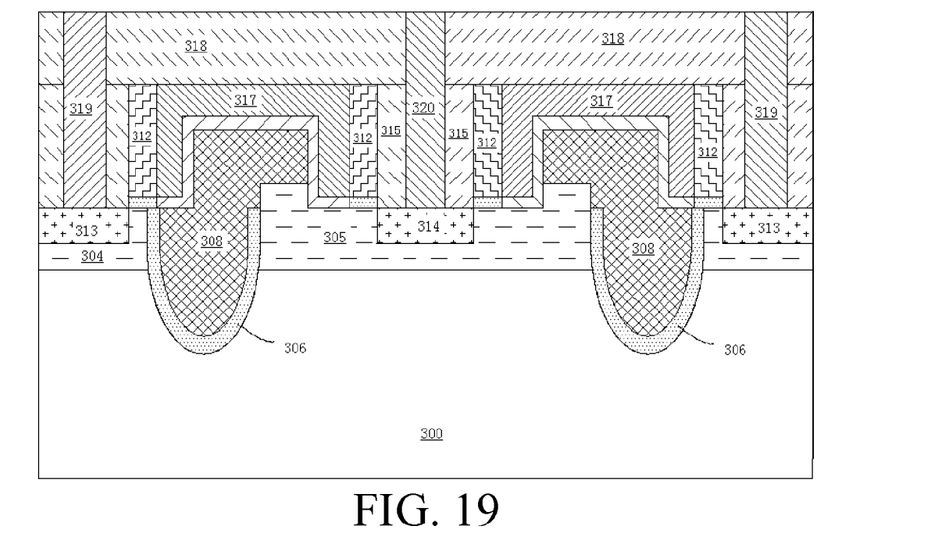
FIG. 19 is a schematic cross-sectional diagram of a semi-floating gate device of a dual-storage unit manufactured according to the present invention.

FIG. 19 illustrates an embodiment of a semi-floating gate device structure with two storage units manufactured according to the present invention, which is constituted by two semi-floating gate devices as shown in FIG. 18, where the two semi-floating gate devices present a symmetrical structure, the two semi-floating gate devices share the drain region 305, drain region contact 314, and drain region electrode 320, and the semi-floating gate device structure with two storage units can store two-bit data.

Figure 20:
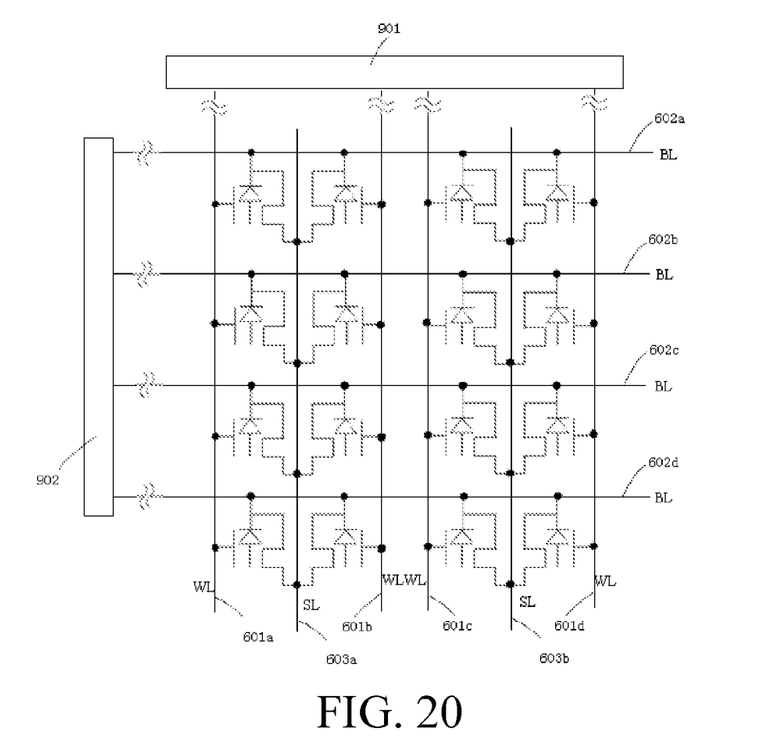
FIG. 20 is a schematic diagram of a circuit of a storage unit array constituted by a plurality of semi-floating gate devices manufactured according to the present invention.

FIG. 20 is a schematic diagram of a circuit of a storage unit array constituted by a plurality of semi-floating gate devices as shown in FIG. 18 manufactured according to the present invention. As shown in FIG. 20, any one among a plurality of source lines SL 603a-603b is connected to sources of the plurality of semi-floating gate devices; any one among a plurality of word lines WL 601a-601d is connected to control gates in the plurality of the semi-floating gate devices; any one among a plurality of bit lines BL 602a-602d is connected to drains of the plurality of semi-floating gate devices; any one among the plurality of bit lines BL 602a-602d may be combined with any one of the plurality of word lines WL 601a-601d, which can select an independent semi-floating gate device; the word lines WL 601a-601d may be selected by a word line address decoder 901, the bit lines BL 602a-602d may be selected by a bit line selection control module 902, and the bit line selection control module 902 generally includes an address decoder, a multi-way selector, and a group of sense amplifiers; and meanwhile, the source lines SL 603a and 603b may be connected to a common source line or a source line selection control module.

Any technical means that is not explained in the present invention is prior art well-known to a person skilled in the art.

The specific implementation manners disclosed above with reference to the accompanying drawings and embodiments specifically support the technical thought of a method for manufacturing a semi-floating gate device proposed in the present invention and cannot be used to define the protection scope of the present invention. Any equivalent variations or equivalent modifications made according to the technical thought proposed in the present invention and on the basis of the present technical solution still belong to the scope claimed by the technical solution of the present invention.

What is claimed is:

1. A method for manufacturing a semi-floating gate device, comprising:
   a process for forming a U-shaped groove in Step 1;
   a process for forming a floating gate and a floating gate opening region in Step 2, following Step 1; and
   a process for forming a source electrode, a drain electrode, and a control gate in Step 3, following Step 2,
   wherein the process for forming a U-shaped groove in Step 1 comprises the following in sequence:
      forming a doped well of a second doping type in a semiconductor substrate of a first doping type;
      forming a first layer of insulating film and a second layer of insulating film in sequence on a surface of the semiconductor substrate; and
      positioning a location of a channel region by means of a photolithography process, and then etching the second layer of insulating film, the first layer of insulating film, and the semiconductor substrate to form a U-shaped groove having a bottom lower than a bottom of the doped well, wherein the U-shaped groove divides the doped well into a drain region and a source region, and
   wherein the process for forming a floating gate and a floating gate opening region in Step 2 comprises the following in sequence:
      growing a third layer of insulating film on a surface of the U-shaped groove formed in Step 1;
      depositing a first layer of polycrystalline silicon to cover the U-shaped groove, until the first layer of polycrystalline silicon fills up the U-shaped groove;
      etching back the first layer of polycrystalline silicon, wherein a top of the remaining first layer of polycrystalline silicon after the etching is located between an upper surface of the second layer of insulating film and the bottom of the doped well;
      etching away the second layer of insulating film, the first layer of insulating film, and the exposed third layer of insulating film;
      depositing a second layer of polycrystalline silicon on the structure formed by the above-mentioned etching processing, wherein the second layer of polycrystalline silicon and the first layer of polycrystalline silicon form a polycrystalline silicon layer; and
      depositing a layer of photoresist and forming a pattern by means of a photolithography process, and then etching the polycrystalline silicon layer along the photoresist pattern to form a floating gate and a floating gate opening region, wherein an etching depth is between a bottom of the drain region and the source region and a top of the third layer of insulating film.

2. The method for manufacturing a semi-floating gate device according to claim 1, wherein the process for forming a source electrode, a drain electrode, and a control gate in Step 3 comprise the following in sequence:
   growing a fourth layer of insulating film on a surface of the structure formed in Step 2, and depositing a third layer of polycrystalline silicon on the fourth layer of insulating film;
   depositing a fifth layer of insulating film on the third layer of polycrystalline silicon;
   etching the formed fifth layer of insulating film and the third layer of polycrystalline silicon by means of a photolithography process and an etching process and forming, by the remaining third layer of polycrystalline silicon after the etching, a polycrystalline silicon control gate sacrifice material;

depositing a sixth layer of insulating film on the device of the formed structure and etching back the formed sixth layer of insulating film to form a gate side wall;

performing source and drain etching and an epitaxial growth process at both sides of the formed gate side wall, so as to form contact regions of the source region and the drain region;

depositing a first layer of interlayer dielectric material on the device of the formed structure and performing polishing until the polycrystalline silicon control gate sacrifice material is exposed;

etching away the exposed polycrystalline silicon control gate sacrifice material;

depositing a seventh layer of insulating film and a layer of metal control gate material on the fourth layer of insulating film, and performing polishing to enable the metal control gate material to occupy a location of the polycrystalline silicon control gate sacrifice material; and depositing a second layer of interlayer dielectric material on the device of the formed structure, and arranging contact holes in the second layer of interlayer dielectric material and the first layer of interlayer dielectric material, and forming a source electrode, a drain electrode, and a gate electrode.

3. The method for manufacturing a semi-floating gate device according to claim 2, wherein Step 3 comprises after etching away the polycrystalline silicon control gate sacrifice material, first etching away the fourth layer of insulating film and then forming the seventh layer of insulating film and the metal control gate.

4. The method for manufacturing a semi-floating gate device according to claim 2, wherein Step 3 further comprises, after etching away the polycrystalline silicon control gate sacrifice material, directly covering the fourth layer of insulating film to form the metal control gate.

5. The method for manufacturing a semi-floating gate device according to claim 2, wherein Step 3 further comprises, after forming the gate side wall, directly forming a high-concentration doped region in the source region and the drain region by means of an ion injection method, so as to form contact regions of the source region and the drain region.

6. The method for manufacturing a semi-floating gate device according to claim 1, wherein a material of the first layer of insulating film is silicon oxide, and a material of the second layer of insulating film is silicon nitride.

7. The method for manufacturing a semi-floating gate device according to claim 1, wherein each of the fifth layer of insulating film and the sixth layer of insulating film comprises silicon oxide or silicon nitride.

8. The method for manufacturing a semi-floating gate device according to claim 2, wherein each of the fifth layer of insulating film and the sixth layer of insulating film comprises silicon oxide or silicon nitride.

9. The method for manufacturing a semi-floating gate device according to claim 3, wherein each of the fifth layer of insulating film and the sixth layer of insulating film comprises silicon oxide or silicon nitride.

10. The method for manufacturing a semi-floating gate device according to claim 4, wherein each of the fifth layer of insulating film and the sixth layer of insulating film comprises silicon oxide or silicon nitride.

11. The method for manufacturing a semi-floating gate device according to claim 5, wherein each of the fifth layer of insulating film and the sixth layer of insulating film comprises silicon oxide or silicon nitride.

12. The method for manufacturing a semi-floating gate device according to claim 1, wherein each of the third layer of insulating film, the fourth layer of insulating film, and the seventh layer of insulating film comprises silicon dioxide, silicon nitride, an insulating material with a high dielectric constant, or a laminated layer thereof.

13. The method for manufacturing a semi-floating gate device according to claim 2, wherein each of the third layer of insulating film, the fourth layer of insulating film, and the seventh layer of insulating film comprises silicon dioxide, silicon nitride, an insulating material with a high dielectric constant, or a laminated layer thereof.

14. The method for manufacturing a semi-floating gate device according to claim 3, wherein each of the third layer of insulating film, the fourth layer of insulating film, and the seventh layer of insulating film comprises silicon dioxide, silicon nitride, an insulating material with a high dielectric constant, or a laminated layer thereof.

15. The method for manufacturing a semi-floating gate device according to claim 4, wherein each of the third layer of insulating film, the fourth layer of insulating film, and the seventh layer of insulating film comprises silicon dioxide, silicon nitride, an insulating material with a high dielectric constant, or a laminated layer thereof.

16. The method for manufacturing a semi-floating gate device according to claim 5, wherein each of the third layer of insulating film, the fourth layer of insulating film, and the seventh layer of insulating film comprises silicon dioxide, silicon nitride, an insulating material with a high dielectric constant, or a laminated layer thereof.

* * * * *